(12) United States Patent
Goel et al.

(10) Patent No.: US 12,294,348 B2
(45) Date of Patent: May 6, 2025

(54) SINGLE STAGE EMI FILTER DESIGN TO MEET EMI REQUIREMENTS

(71) Applicant: Ciena Corporation, Hanover, MD (US)

(72) Inventors: Karan Goel, Gurugram (IN); Chander Gupta, Gurugram (IN); Sujoy Mandal, Gurugram (IN); Anand Kumar, Gurugram (IN)

(73) Assignee: Ciena Corporation, Hanover, MD (US)

( * ) Notice: Subject to any disclaimer, the term of this patent is extended or adjusted under 35 U.S.C. 154(b) by 300 days.

(21) Appl. No.: 18/296,581

(22) Filed: Apr. 6, 2023

(65) Prior Publication Data

US 2023/0361747 A1 Nov. 9, 2023

(30) Foreign Application Priority Data

May 2, 2022 (IN) .............................. 202211025522

(51) Int. Cl.
*H03H 7/01* (2006.01)
*H03H 7/42* (2006.01)

(52) U.S. Cl.
CPC .......... *H03H 7/427* (2013.01); *H03H 7/0115* (2013.01); *H03H 7/0153* (2013.01)

(58) Field of Classification Search
CPC .......... H03H 7/00; H03H 7/01; H03H 7/0115; H03H 7/09; H03H 7/0153; H03H 7/42; H03H 7/427
USPC ................. 333/181, 182, 183, 184, 185, 186
See application file for complete search history.

(56) References Cited

U.S. PATENT DOCUMENTS

| | | | |
|---|---|---|---|
| 6,545,850 B1 | 4/2003 | Shearman et al. | |
| 7,872,843 B2 | 1/2011 | McGill, Sr. et al. | |
| 10,877,230 B1 | 12/2020 | Graham et al. | |
| 11,184,995 B2 | 11/2021 | Graham et al. | |
| 11,356,011 B2 * | 6/2022 | Wang | H02M 3/33507 |
| 11,522,512 B2 * | 12/2022 | Scaramucci | H02M 1/44 |
| 2014/0117774 A1 | 5/2014 | McGill, Sr. et al. | |
| 2019/0327188 A1 | 10/2019 | Rivaud et al. | |
| 2021/0112315 A1 | 4/2021 | Mays | |
| 2021/0243915 A1 | 8/2021 | Saturley et al. | |
| 2021/0382252 A1 | 12/2021 | Shearman et al. | |
| 2022/0304193 A1 | 9/2022 | Shearman et al. | |
| 2022/0308299 A1 | 9/2022 | Rivaud et al. | |

OTHER PUBLICATIONS

BSI Standards Publication, "Electromagnetic compatibility of multimedia equipment—Emission Requirements," BS EN 55032:2015, Jul. 2015, pp. 1-110.

* cited by examiner

*Primary Examiner* — Hai L Nguyen
(74) *Attorney, Agent, or Firm* — Baratta Law PLLC; Lawrence A. Baratta, Jr.

(57) ABSTRACT

A single stage electromagnetic interference (EMI) filter circuit includes a power source input configured to connect to a power source; an equivalent common mode and differential mode filter including a single inductor having both common mode inductance for common mode filtering and specific parasitic inductance; and a differential capacitance stage connected to the single inductor in parallel, wherein a combination of the specific parasitic inductance and capacitance of the differential capacitance stage are used to provide differential mode filtering.

20 Claims, 7 Drawing Sheets

SINGLE STAGE EMI FILTER DESIGN TO MEET EMI REQUIREMENTS

CROSS-REFERENCE TO RELATED APPLICATION(S)

The present disclosure claims priority to Indian Patent Application No. 202211025522, filed May 2, 2022, the contents of which are incorporated by reference in their entirety.

FIELD OF THE DISCLOSURE

The present disclosure generally relates to electrical circuits. More particularly, the present disclosure relates to systems and methods for a single stage electromagnetic interference (EMI) filter design to meet EMI requirements.

BACKGROUND OF THE DISCLOSURE

EMI filters are used on power supplies to meet various noise (EMI) requirements. Telecom Systems enclosing high-speed electronics need to meet International regulatory Noise Emission requirements. These are defined, e.g., by Electromagnetic Interference/Compatibility (EMI/EMC) standards like CISPR 32; EN 55032 etc. To meet these requirements, an EMI filter circuit is required at the power Input of telecom system. The filter is designed such that any electromagnetic noise from the system should be attenuated as per standard limits before returning to the main power source.

Power supplies generate two types of noise—differential and common mode noise. To attenuate both differential mode and common mode node, a filter stage is designed with a common mode filter and a differential mode filter. Disadvantageously, having both common mode and differential mode filter stage is a challenge for small form factor or low-cost designs. An additional differential inductor increases complexity, size, and cost.

BRIEF SUMMARY OF THE DISCLOSURE

The present disclosure relates to systems and methods for a single stage electromagnetic interference (EMI) filter design to meet EMI requirements. The present disclosure includes a circuit using the parasitic leakage inductance of single stage EMI filter's common mode choke as a differential mode filter to replace the two separate chokes typically used in dual stage EMI filter designs. Of note, the conventional approach is to reduce the parasitic leakage inductance of the common mode choke as low as possible. However, in the present disclosure, we maintain and configure this parasitic leakage inductance to 2-4% of common mode inductance, versus the conventional approach of limiting it 1% of common mode inductance value. This parasitic leakage inductance of the common mode choke is used for the differential mode filter. The appropriate leakage inductance of common mode choke along with right differential capacitance helps to attenuate both differential mode and common mode noise and thus eliminates the need for differential inductor, i.e., two stages, namely a common mode filter and a differential mode filter. Advantageously, the single stage EMI filter has a compact design, less complexity, and lower cost, while also exceeding relevant EMI specifications. In one example application, the single stage EMI filter compact design allows use in a small form factor telecom system.

In an embodiment, a single stage electromagnetic interference (EMI) filter circuit includes a power source input configured to connect to a power source; an equivalent common mode and differential mode filter including a single inductor having both common mode inductance for common mode filtering and specific parasitic inductance; and a differential capacitance stage connected to the single inductor in parallel, wherein a combination of the specific parasitic inductance and capacitance of the differential capacitance stage are used to provide differential mode filtering. The power source can have a power source type of a plurality of different power source types. The different power source types can be Alternating Current (AC) and Direct Current (DC). The different power source types can be Direct Current (DC), Sinusoidal Alternating Current (AC), and Quasi Sinusoidal wave AC. The different power source types can also be any of a 120V Alternating Current (AC), 48V Direct Current (DC), and 75V Cable Television (CATV) power. The specific parasitic inductance can be between 2-4% of common mode inductance.

The single stage EMI filter circuit can further include a one or more surge protectors located between the power source input and the equivalent common mode and differential mode filter. The single stage EMI filter circuit can further include an X capacitor for the differential capacitance stage; and a plurality of Y capacitors for common mode capacitance. The X capacitor can be located before and in parallel with the single inductor. The X capacitor can be located after and in parallel with the single inductor. The X capacitor can be located after and in parallel with the single inductor, and the single stage EMI filter circuit can further include a second X capacitor located before and in parallel with the single inductor. The plurality of Y capacitors can be in two stages, one before and in parallel with the single inductor, and another after and in parallel with the single inductor.

In another embodiment, a network device includes a housing or chassis; a power distribution unit in the housing or chassis; and the single stage EMI filter circuit described above.

In a further embodiment, a method of single stage electromagnetic interference (EMI) filtering includes receiving power from a power source; performing common mode filtering with an equivalent common mode and differential mode filter that includes a single inductor and that has both common mode inductance for common mode filtering and specific parasitic inductance; and performing differential mode filtering with the single inductor and a differential capacitance stage connected to the single inductor in parallel, wherein a combination of the specific parasitic inductance and capacitance of the differential capacitance stage are used for the differential mode filtering. The power source can have a power source type of a plurality of different power source types.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

Again, the present disclosure relates to systems and methods for a single stage electromagnetic interference (EMI) filter design to meet EMI requirements. The present disclosure includes a circuit using the parasitic leakage inductance of single stage EMI filter's common mode choke as a differential mode filter to replace the two separate chokes typically used in dual stage EMI filter designs. Of note, the conventional approach is to reduce the parasitic leakage inductance of the common mode choke as low as possible. However, in the present disclosure, we maintain and configure this parasitic leakage inductance to some value, e.g., around 2-4% of common mode inductance, versus the typical 1% of common mode inductance value. This parasitic leakage inductance of the common mode choke is used for the differential mode filter. The appropriate leakage inductance of common mode choke along with right differential capacitance helps to attenuate both differential mode and common mode noise and thus eliminates the need for differential inductor, i.e., two stages, namely a common mode filter and a differential mode filter. Advantageously, the single stage EMI filter has a compact design, less complexity, and lower cost, while also exceeding relevant EMI specifications. In one example application, the single stage EMI filter compact design allows use in a small form factor telecom system.

Again, telecom systems with high-speed electronics need to meet International regulatory noise emission requirements. These are defined by Electromagnetic Interference/Compatibility (EMI/EMC) standards like CISPR 32; EN 55032 etc. To meet these requirements, an EMI filter circuit is required at the power Input of telecom system. The filter is designed such that any electromagnetic noise from the system should be attenuated as per standard limits before returning to the main power source.

The present disclosure relates to a single stage EMI filter design to meet EMI requirements, for use in telecom applications, for use with multiple power input types, for use in compact form factors, for use in outdoor hardened devices, for use in data center or other indoor implementations, and combinations thereof. The following description relates to an outdoor telecom product. Those skilled in the art will recognize this is one use for the single stage EMI filter design, and other use cases are contemplated herewith. Stated differently, the single stage EMI filter design is advantageous in the outdoor telecom product described herein, but its use is contemplated in any application, form factor, etc.

Power Sources

For example, there are mainly three power sources used in telecom products:

1.) Universal AC (90-265 VAC 50/60 Hz Sinusoidal)
2.) DC (36V-75V)
3.) Cable AC (60-90 VAC 50/60 Hz Quasi Sine Wave)

Direct Current (DC), typically −48V, is the typical power source for indoor telecom equipment, i.e., racks, frames, etc. having a Power Distribution Unit (PDU) that connects to a DC power source.

Alternating Current (AC), typically 120V in the U.S., is the typical power source for data products, such as rack mounted units, integrated devices, so-called "pizza boxes" called this because of their resemblance thereto, and the like. This power source is can be a wall outlet.

Cable AC is the typical power source for cable products, such as used in cable company networks, e.g., Multiple System Operators (MSOs). These products may include outdoor products, such as installed on a pole, in a hardened form factor.

As described herein, the term "telecom" product, device, system, etc. is meant tor refer to a physical implementation of a network device, for use in any type of network, i.e., not limited to telecom, but could be data, cable, wireless, a Local Area Network (LAN), a Wide Area Network (WAN), a campus network, an enterprise network, and the like. That is, in an embodiment, the single stage EMI filter design is for use in hardware used to realize a network device.

As can be appreciated based on the different power sources listed above, as well as ones that are not listed, a given EMI filter needs to support different types of power sources. That is, the network device is configured to receive one power input, but that power input may be one of a plurality of different power source types. The single stage EMI filter design contemplates this configuration, i.e., one power input with the power source being one of a plurality of different power source types.

The description of the outdoor telecom product herein contemplates all three types of power sources, namely DC, AC, and Cable AC. In another embodiment, a network device could only require DC and AC, such as a network device for indoor use in a data center, in a Service Provider (SP)'s network, and the like.

EMI Filter

Figure 1:
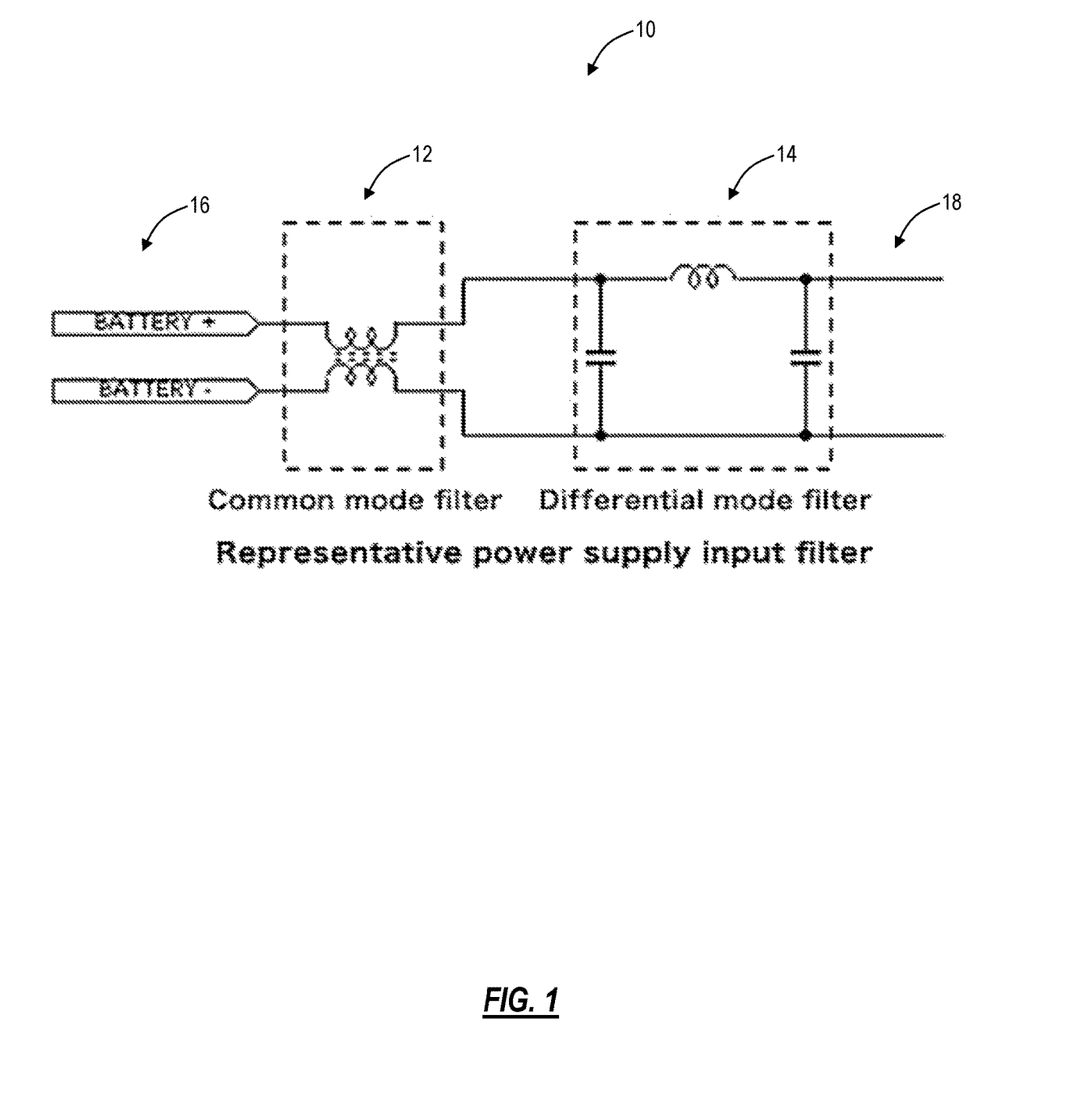
FIG. 1 is a circuit diagram of a power supply input filter having a common mode filter stage and a differential mode filter stage.

FIG. 1 is a circuit diagram of a power supply input filter 10 having a common mode filter stage 12 and a differential mode filter stage 14. In this example, the common mode filter stage 12 is connected to a power source 16, e.g., a battery providing DC power. Again, the power supply input filter 10 includes two stages, for the common mode and the differential mode. That is, the power supply input filter 10 is an EMI Filter designed as a two-stage filter with two types of chokes to attenuate two types of noise: differential mode and common mode.

The common mode filter stage 12 includes a common mode choke (CMC) set of Y capacitors which attenuate the noise generated common to positive and negative inputs, of the power source 16, with respect to ground. The differential mode filter stage 14 includes a differential choke along with an X capacitor which attenuates the noise generated between the positive and negative input terminal, of the power source 16. That is, the common mode filter attenuates noise common to positive and negative inputs, of the power source 16, with respect to ground, and the differential mode attenuates the noise generated between the positive and negative input.

X capacitors are required for connections between mains or neutral. Y capacitors are required whenever there is a connection to grounded nodes. Due to the fact that equipment cases are usually grounded, Y caps require higher safety to avoid risks of electrical shocks to users.

Finally, outputs 18 from the differential mode filter stage 14 connect to a power supply (not shown), providing EMI filtered power, from the power source 16.

Single Stage EMI Filter

Figure 2:
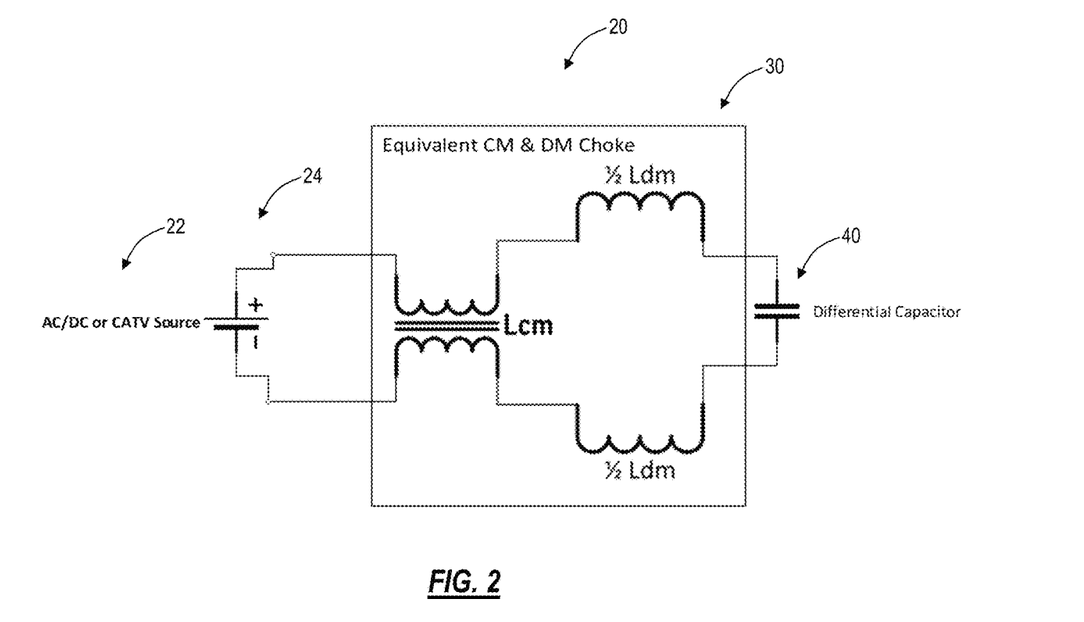
FIG. 2 is a circuit diagram of a single stage EMI filter according to various embodiments of the present disclosure.
Figure 3:
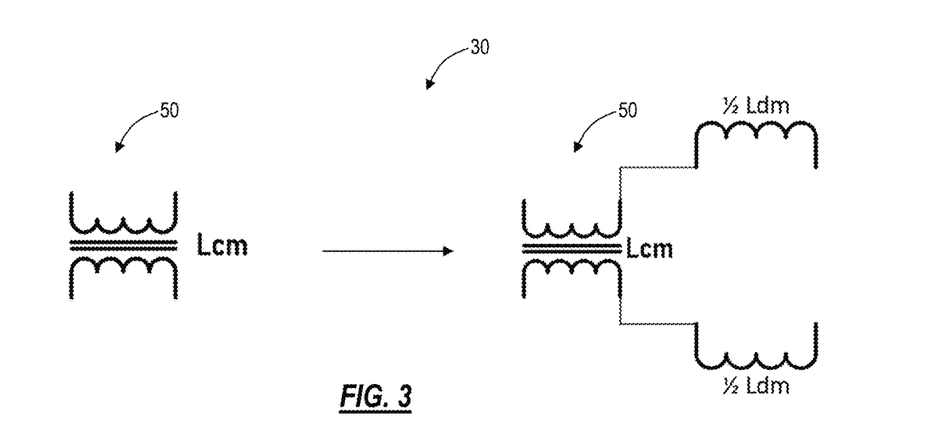
FIG. 3 is a circuit diagram of a common mode inductor Lcm providing common mode inductance and acting as a differential mode inductor Ldm based on specific values of parasitic inductance, for the single stage EMI filter of FIG. 2.

FIG. 2 is a circuit diagram of a single stage EMI filter 20 according to various embodiments of the present disclosure. FIG. 3 is a circuit diagram of a common mode inductor Lcm providing common mode inductance and acting as a differential mode inductor Ldm based on specific values of parasitic inductance. The single stage EMI filter 20 is a circuit designed to meet the Telecom EMI requirements using a compact single stage EMI Filter. The single stage EMI filter 20 eliminates the differential choke, namely the differential mode filter stage 14 in the power supply input filter 10. The single stage EMI filter 20 can include a common design for different power sources 22, e.g., AC/DC and CATV source by using high voltage filter parts.

The single stage EMI filter 20 includes a power source input 24 configured to connect to the power source 22. The power source 22 can be a power source type of a plurality of power source types, e.g., AC, DC, Cable AC, etc. In another embodiment, the power source 22 can be configured to connect to a single power source type.

The power source input 24 is connected to an equivalent common mode and differential mode filter 30, which connects to a differential capacitance stage 40, which connects to a power supply (not shown), providing EMI filtered power, from the power source 22.

FIG. 3 illustrates the inductance in the equivalent common mode and differential mode filter 30. The single stage EMI filter 20, instead of using a conventional approach that selects a common mode choke with 1% parasitic inductance, includes a selected choke, of the Lcm, with 2-4% of parasitic Inductance value of common mode choke. As is known in the art, parasitic inductance is an unwanted inductance effect that is unavoidably present in all real electronic devices. As opposed to deliberate inductance, which is introduced into the circuit by the use of an inductor, parasitic inductance is almost always an undesired effect. There are various approaches in the art for reducing parasitic inductance, e.g., selecting appropriate signal traces, using the ground plane, reducing vias, etc. Also, as is known in the art, parasitic inductance is also referred to as leakage inductance.

Of note, we are avoiding the process of reducing the parasitic inductance, but instead welcoming the parasitic inductance for use in differential mode filtering. That is, the equivalent common mode and differential mode filter 30 achieves both common mode filtering and differential mode filtering with the same hardware, FIG. 3 illustrates the equivalent circuit view where we use a single inductor 50, but model its inductance as Lcm in series and as ½ Ldm in two parallel lines.

The equivalent common mode and differential mode filter 30 can be referred to as a "choke," and by selecting a choke with mid- to high parasitic inductance (instead of the minimum possible), this enables us to match it with a suitable X capacitance, in the differential capacitance stage 40, to provides significant differential noise attenuation.

The leakage (parasitic) inductance of the single inductor 50, when paired with the right differential capacitor, differential capacitance stage 40, can filter mid to low differential noise frequency spectrum (e.g., 150 Khz-30 Mhz), thereby supporting both common mode filtering and differential mode filtering in a single stage, namely the equivalent common mode and differential mode filter 30. This helps attenuate the differential noise without the differential choke. Also, by choosing High Voltage parts Isolation and creepage requirements are met for all 3 power sources. (AC/DC & CATV).

Example Circuit Implementation of the Single Stage EMI Filter

Figure 4:
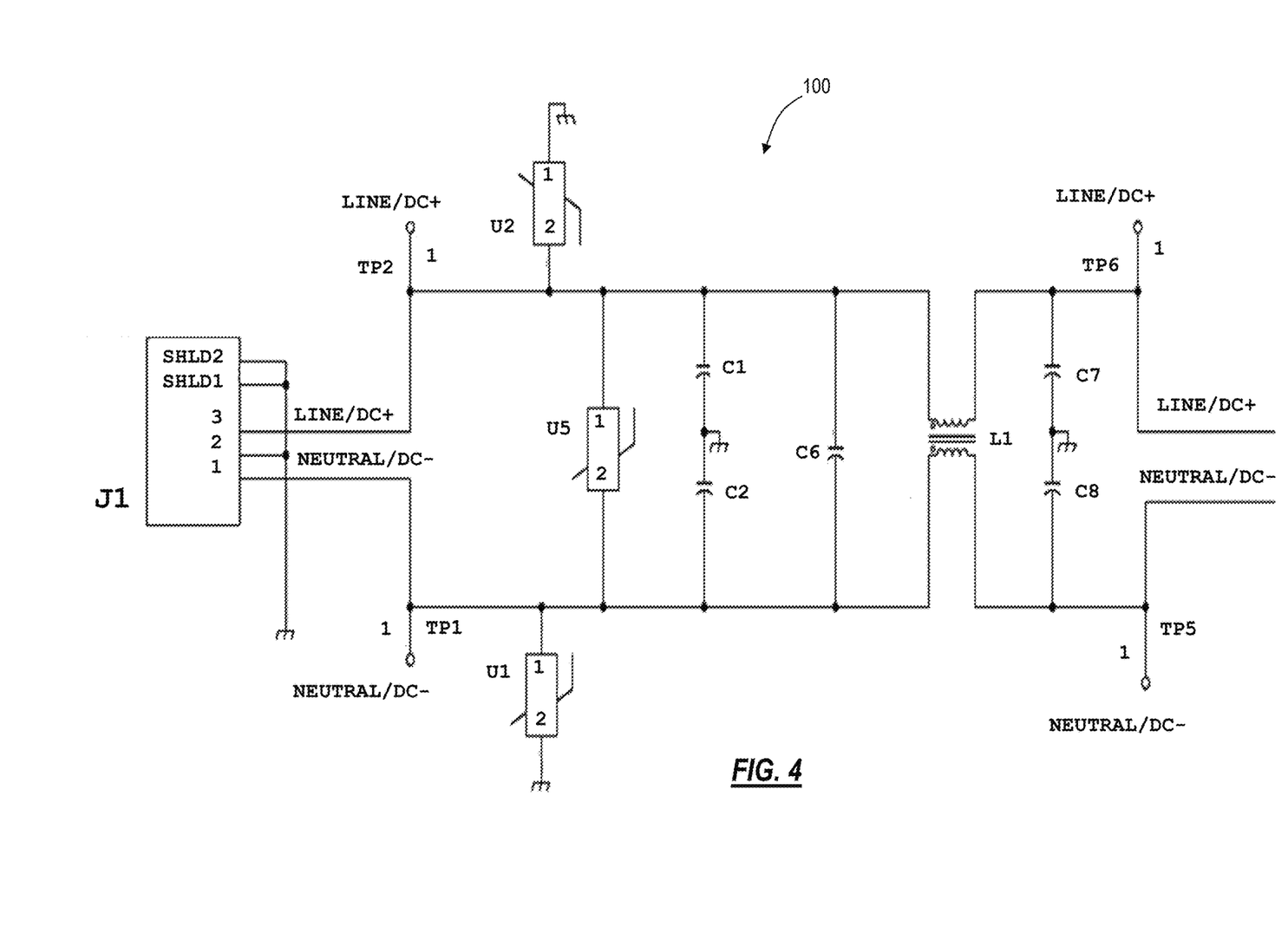
FIG. 4 is a circuit diagram of an example implementation of a single stage EMI filter circuit, based on the single stage EMI filter of FIG. 2.

FIG. 4 is a circuit diagram of an example implementation of a single stage EMI filter circuit 100, based on the single stage EMI filter 20. Those skilled in the art will appreciate the circuit 100 is one example implementation, and all such equivalents based on the description of the single stage EMI filter 20, the equivalent common mode and differential mode filter 30, the differential capacitance stage 40, and the single inductor 50 are contemplated herein.

The circuit 100 includes an input power connection J1 which includes a line DC+ input and a neutral DC-input, each configured to connect to a power supply (not shown). There are three Metal Oxide Varistors (MOVs) U1, U2, U5 with the MOV U1 between the neutral DC- and ground, the MOV U2 between the line DC+ and ground, and the MOV U5 between the neutral DC- and the line DC+. The MOVs U1, U2, U5 are for lightning and surge protection. That is, the circuit 10 can include a plurality of surge protectors U1, U2, U5, each configured to connect to any of the line DC+ input, the neutral DC-input, and ground.

The circuit 100 is an implementation of the single stage EMI filter 20 to meet EMI/EMC compliance. The circuit 100 includes a common mode choke with leakage inductance (inductor L1), a differential filter capacitor (C6) (e.g., an X capacitor) and two stages of common mode Y capacitors (C1, C2, C7, C8). Note, the terms "common mode choke," "common mode inductance," and "common mode filtering" can be used interchangeably.

The capacitor C2 is located between the neutral DC- and ground. The capacitor C1 is located between the line DC+ and ground. The capacitor C6 is located between neutral DC- and ground DC+ as is the inductor L1. The capacitor C8 is located between the neutral DC- and the ground. The capacitor C7 is located between the line DC+ and ground.

The inductor L1 choke's parasitic Inductance along with the specific capacitance of the capacitor C6 gives the desired results of an equivalent differential filter stage, as described in FIGS. 2 and 3.

The circuit 100 uses the parasitic leakage inductance of the common mode choke (L1) as a differential mode filter to replace the two separate chokes typically used in dual stage EMI filter designs, as in FIG. 1.

The appropriate leakage inductance of common mode choke along with specific differential capacitance of the capacitor C6 helps to attenuate both differential mode and common mode noise thereby eliminating the need for differential Inductor.

In an embodiment, a single stage hybrid electromagnetic interference (EMI) filter circuit (10), for use in a power supply in a telecom device, includes a line DC+ input and a neutral DC-input, each configured to connect to a power supply; a plurality of surge protectors U1, U2, U5, each configured to connect to any of the line DC+ input, the neutral DC-input, and ground; an inductor L1 that provides a common mode choke with leakage inductance, wherein the inductor L1 is in series between the line DC+ input and the neutral DC-input; a differential filter capacitor C6 between the line DC+ input and the neutral DC-input; and two stages of common mode Y capacitors C1, C2, C7, C8, each configured to connect to any of the line DC+ input, the neutral DC-input, and ground.

The capacitor C2 is located between the neutral DC- and ground. The capacitor C1 is located between the line DC+ and ground. The capacitor C6 is located between neutral DC- and ground DC+ as is the inductor L1. The capacitor C8 is located between the neutral DC- and ground. The capacitor C7 is located between the line DC+ and ground.

The inductor L1 choke's parasitic inductance along with a capacitance of the capacitor C6 gives the desired results of an equivalent differential filter stage. The single stage hybrid EMI filter circuit (10) filters both differential mode and common mode noise. The power supply provides any of a 240V AC, 48V DC, and 75V CATV power.

Single Stage EMI Filter Circuit

With references to FIGS. 2, 3, and 4, in another embodiment, a single stage electromagnetic interference (EMI) filter circuit 20 includes a power source input 24 configured to connect to a power source 22; an equivalent common mode and differential mode filter 30 including a single inductor 50 having both common mode inductance for common mode filtering and specific parasitic inductance; and a differential capacitance stage 40 connected to the single inductor 50 in parallel, wherein a combination of the specific parasitic inductance and capacitance of the differential capacitance stage 40 are used to provide differential mode filtering.

The power source 22 can have a power source type of a plurality of different power source types. For example, the different power source types are Alternating Current (AC) and Direct Current (DC). In another example, the different power source types are Direct Current (DC), Sinusoidal Alternating Current (AC), and Quasi Sinusoidal wave AC. In yet another example, the different power source types are any of a 120V Alternating Current (AC), 48V Direct Current (DC), and 75V Cable Television (CATV) power.

The single stage EMI filter circuit 20 can include a one or more surge protectors located between the power source input and the equivalent common mode and differential mode filter. The single stage EMI filter circuit 20 can further include an X capacitor for the differential capacitance stage; and a plurality of Y capacitors for common mode capacitance. The X capacitor can be located before and in parallel with the single inductor. The plurality of Y capacitors can be in two stages, one before and in parallel with the single inductor, and another after and in parallel with the single inductor.

Example Implementation

Figure 5:
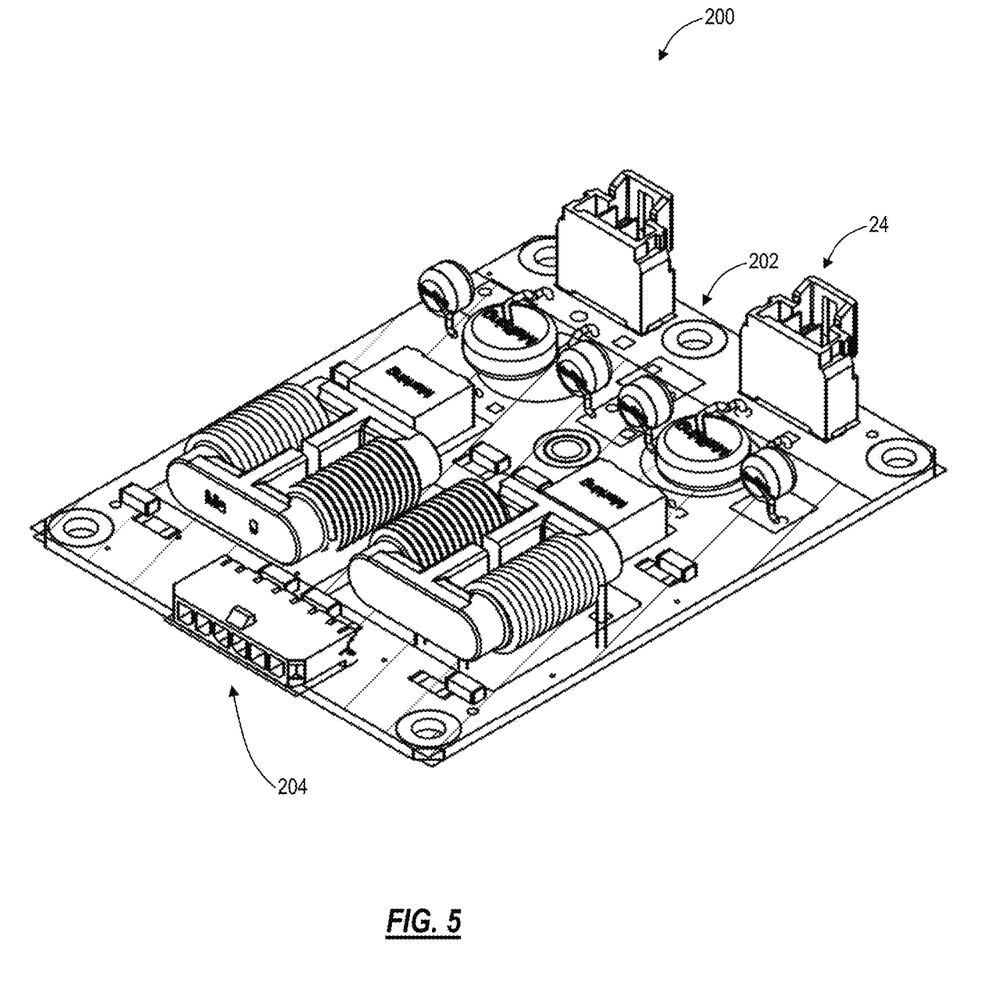
FIG. 5 is a perspective diagram of an example implementation of the single stage EMI filter circuit of FIG. 4, based on the single stage EMI filter of FIG. 2.

FIG. 5 is a perspective diagram of an example implementation 200 of the single stage EMI filter circuit 100, based on the single stage EMI filter 20. The implementation 200 includes the power source input 24, i.e., two connectors, a Printed Circuit Board (PCB) 202, the various components described herein, and a power output 204. Of note, this is a relatively compact implementation, and adding the second stage clearly would increase the size of the implementation 200 significantly.

Example Use in Outdoor Telecom System

Figure 6:
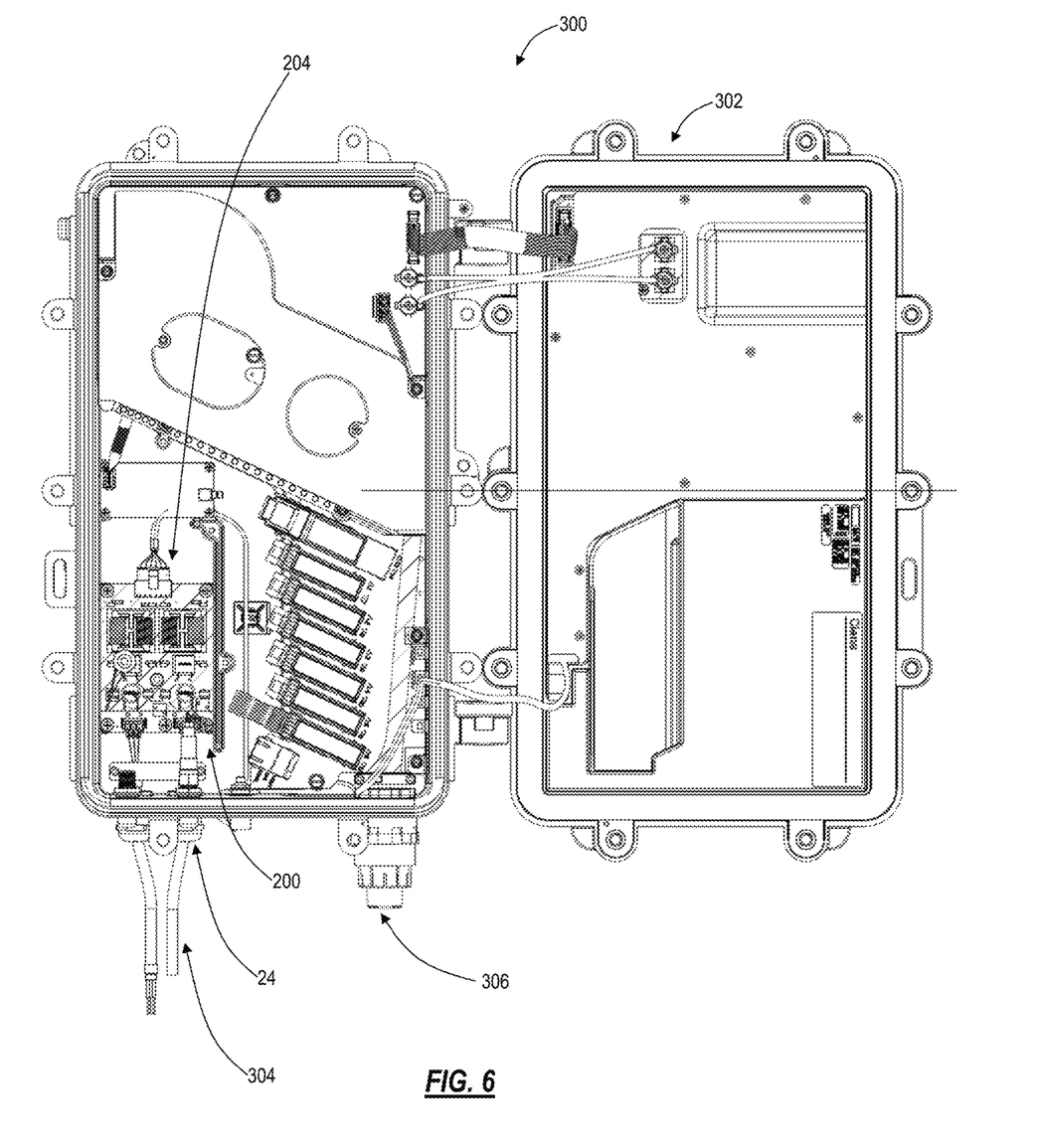
FIG. 6 is a diagram of a network device in a hardened form factor that is open, where the network device includes the example implementation of FIG. 5.
Figure 7:
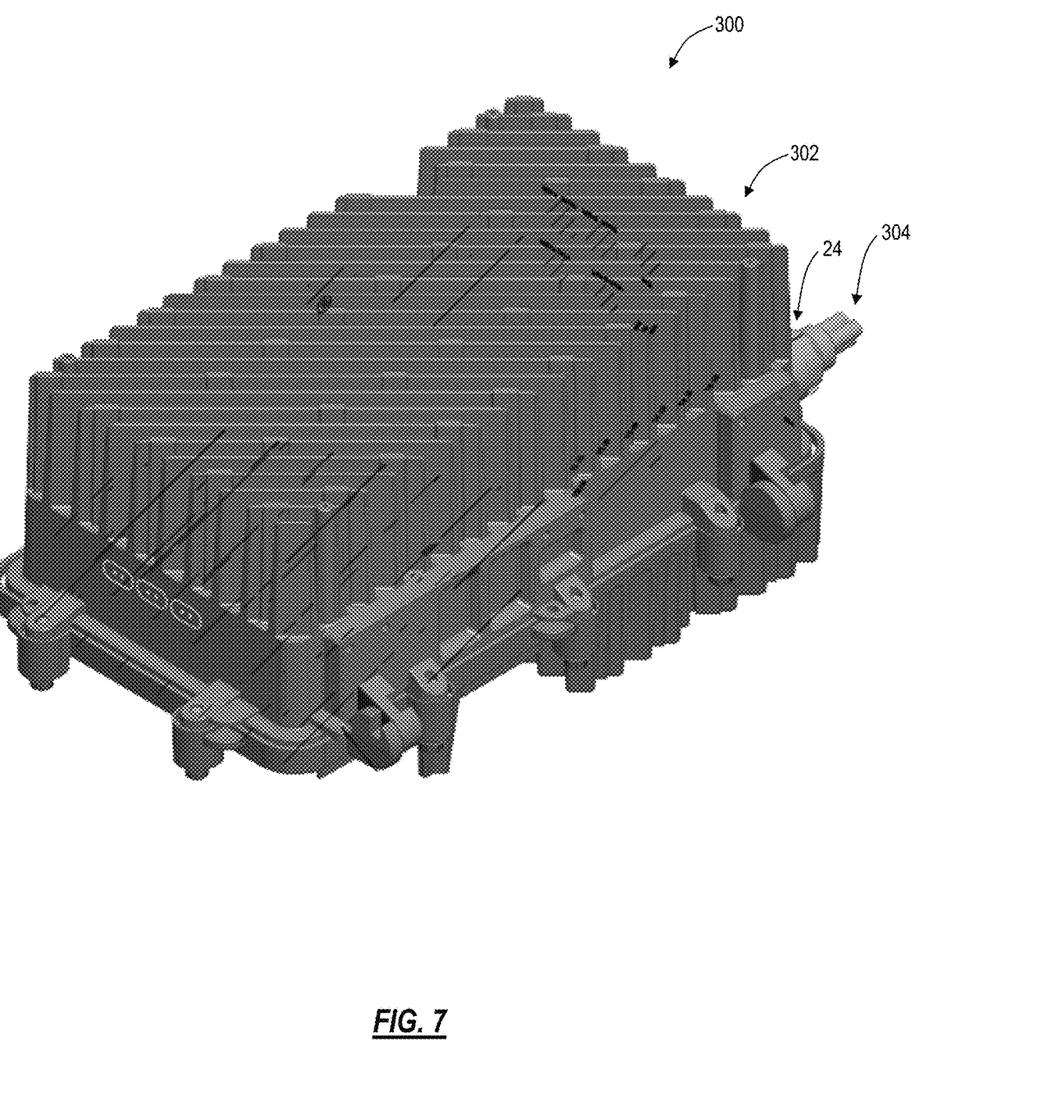
FIG. 7 is a diagram of the network device of FIG. 6 in the hardened form factor that is closed.

FIG. 6 is a diagram of a network device 300 in a hardened form factor 302 that is open. FIG. 7 is a diagram of the network device in the hardened form factor 302 that is closed. In this example, the hardened form factor 302 is meant for outdoor deployment, e.g., on a pole. The hardened form factor 302 is a housing that contains all of the components associated with the network device 300 including the implementation 200 of the single stage EMI filter circuit 100. Because the hardened form factor 302 contemplates mounting on a pole and for other reasons, it has a compact design, necessitating use of the compact form factor of the implementation 200.

As is known in the art, "hardened" means the form factor 302 is designed to withstand environmental conditions outdoors, e.g., rain, wind, heat, snow, moisture, etc. As is seen in FIG. 7, the hardened form factor 302 is closeable and the only cabling thereto are cables 304 to the power source input 24 and data cables through a data connection port 306.

In an embodiment, the hardened form factor 302 requires opening for maintenance, including field replacement of the single stage EMI filter circuit 100 implementation 200. In this manner, the single stage EMI filter circuit 100 implementation 200 may be located on a top cover of the hardened form factor 302 and there may be an extended cable 310 from the power output 204. Here, the extended cable 310 has to route power from the single stage EMI filter circuit 100 implementation 200 at the top cover to the components inside the hardened form factor 302.

In an embodiment, a network device includes a housing or chassis; a power distribution unit in the housing or chassis; and the single stage EMI filter circuit 100 implementation 200 in the housing or chassis.

Test Results

The single stage EMI filter circuit 100 implementation 200 was tested as follows:

| | |
|---|---|
| Test Standard | CISPR 32; EN 55032; ETSI EN 300 386 |
| Class | Class A |
| Frequency Range | 0.15 MHz to 30 MHz |
| Resolution Bandwidth | 9 kHz |
| Video Bandwidth | 30 kHz |
| Step size | 4 kHz |
| Pre-scan meas. time | 20 ms |
| Final meas. time | 1 Sec |
| Attenuation | 10 dB/Auto |
| Applicable Line | Power Line (AC): Line & Neutral |
| | Power Line (DC): Positive & Negative |
| | Power Line (CATV): Line & Neutral |
| | Signal Line: MGMT |
| Cable Type | Shielded/Unshielded |
| Detector | Peak, Quasi Peak & Average |

| | | | |
|---|---|---|---|
| Input voltage | 240 V AC | 48 V DC | 75 V CATV |
| Input frequency | 50 Hz | NA | 50 Hz |

All three power sources (240V AC, 48V DC, 75V CATV) meet Class A EMI Limits with more than 10 dB margin. Also, initial test results show the circuit 100 meets Class B requirements as well. Thus, the design of the single stage EMI filter 20 and the example implementation 200 of the single stage EMI filter circuit 100 has been validated with actual test results which meets CISPR 32 Class A EMI limits with good margins.

Single Stage EMI Filtering Process

Figure 8:
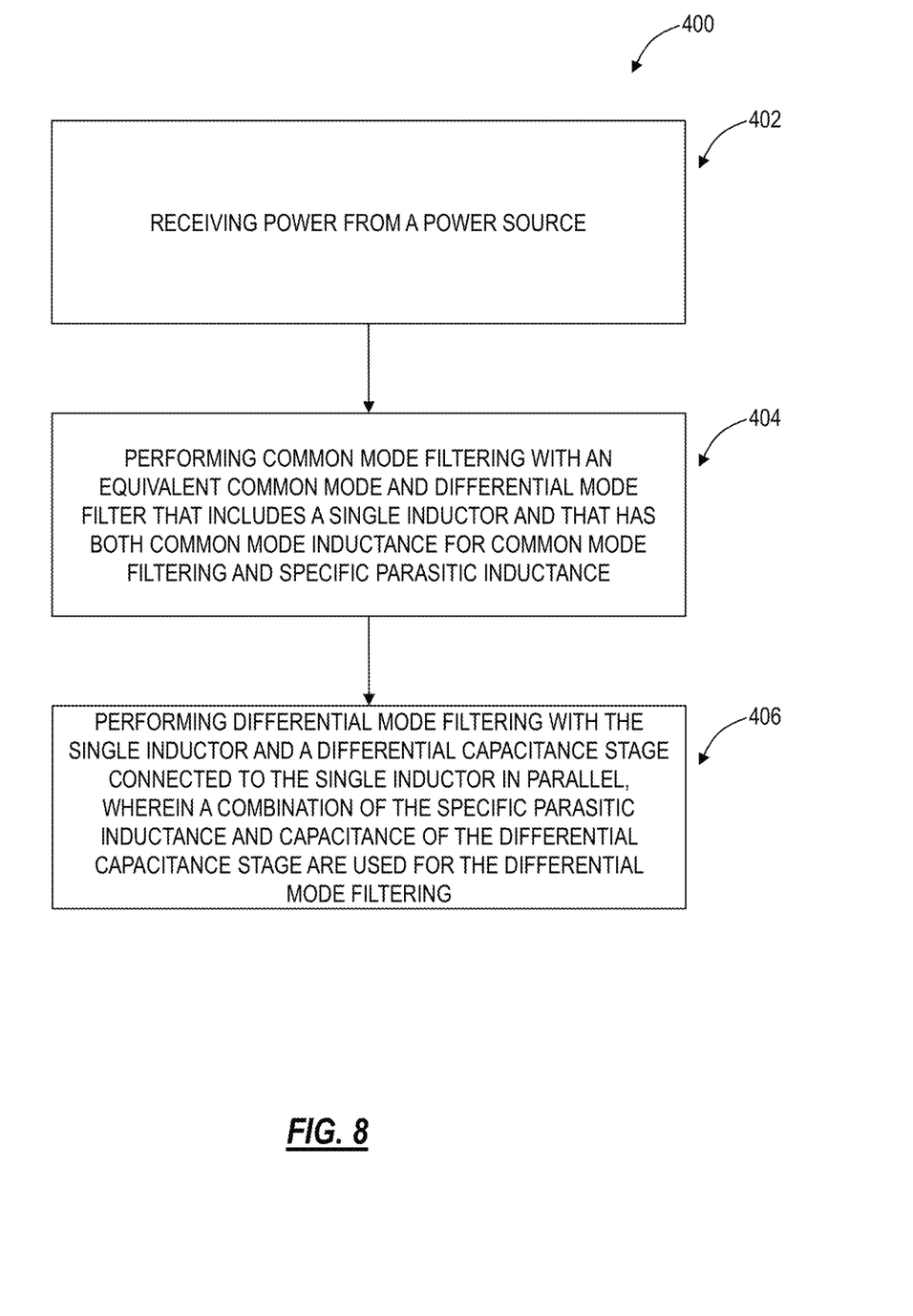
FIG. 8 is a flowchart of a process of single stage EMI filtering according to various embodiments of the present disclosure.

FIG. 8 is a flowchart of a process 400 of single stage EMI filtering according to various embodiments of the present disclosure. The process 400 contemplates implementation via circuit design based on the single stage EMI filter 20 described herein. The process 400 includes receiving power from a power source (step 402); performing common mode filtering with an equivalent common mode and differential mode filter that includes a single inductor and that has both common mode inductance for common mode filtering and specific parasitic inductance (step 404); and performing differential mode filtering with the single inductor and a differential capacitance stage connected to the single inductor in parallel, wherein a combination of the specific parasitic inductance and capacitance of the differential capacitance stage are used for the differential mode filtering.

CONCLUSION

It will be appreciated that some embodiments described herein may include one or more generic or specialized processors ("one or more processors") such as microprocessors; central processing units (CPUs); digital signal processors (DSPs): customized processors such as network processors (NPs) or network processing units (NPUs), graphics processing units (GPUs), or the like; field programmable gate arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more application-specific integrated circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured or adapted to," "logic configured or adapted to," etc. perform a set of operations, steps, methods, processes, algorithms, functions, techniques, etc. on digital and/or analog signals as described herein for the various embodiments.

Moreover, some embodiments may include a non-transitory computer-readable storage medium having computer-readable code stored thereon for programming a computer, server, appliance, device, processor, circuit, etc. each of which may include a processor to perform functions as described and claimed herein. Examples of such computer-readable storage mediums include, but are not limited to, a hard disk, an optical storage device, a magnetic storage device, a read-only memory (ROM), a programmable read-only memory (PROM), an erasable programmable read-only memory (EPROM), an electrically erasable programmable read-only memory (EEPROM), Flash memory, and the like. When stored in the non-transitory computer-readable medium, software can include instructions executable by a processor or device (e.g., any type of programmable circuitry or logic) that, in response to such execution, cause a processor or the device to perform a set of operations, steps, methods, processes, algorithms, functions, techniques, etc. as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims. The foregoing sections may include headers for various embodiments and those skilled in the art will appreciate these various embodiments may be used in combination with one another as well as individually. Further, it is noted that the various elements, operations, steps, methods, processes, algorithms, functions, techniques, etc. described herein can be used in any and all combinations with one another.

What is claimed is:

1. A single stage electromagnetic interference (EMI) filter circuit comprising:
a power source input configured to connect to a power source;
an equivalent common mode and differential mode filter including a single inductor having both common mode inductance for common mode filtering and specific parasitic inductance; and
a differential capacitance stage connected to the single inductor in parallel, wherein a combination of the specific parasitic inductance and capacitance of the differential capacitance stage are used to provide differential mode filtering.

2. The single stage EMI filter circuit of claim 1, wherein the power source has a power source type of a plurality of different power source types.

3. The single stage EMI filter circuit of claim 2, wherein the different power source types are Alternating Current (AC) and Direct Current (DC).

4. The single stage EMI filter circuit of claim 2, wherein the different power source types are Direct Current (DC), Sinusoidal Alternating Current (AC), and Quasi Sinusoidal wave AC.

5. The single stage EMI filter circuit of claim 2, wherein the different power source types are any of a 120V Alternating Current (AC), 48V Direct Current (DC), and 75V Cable Television (CATV) power.

6. The single stage EMI filter circuit of claim 1, further comprising:
a one or more surge protectors located between the power source input and the equivalent common mode and differential mode filter.

7. The single stage EMI filter circuit of claim 1, further comprising:
an X capacitor for the differential capacitance stage; and
a plurality of Y capacitors for common mode capacitance.

8. The single stage EMI filter circuit of claim 7, wherein the X capacitor is located before and in parallel with the single inductor.

9. The single stage EMI filter circuit of claim 7, wherein the X capacitor is located after and in parallel with the single inductor.

10. The single stage EMI filter circuit of claim 7, wherein the X capacitor is located after and in parallel with the single inductor, and further comprising a second X capacitor located before and in parallel with the single inductor.

11. The single stage EMI filter circuit of claim 7, wherein the plurality of Y capacitors are in two stages, one before and in parallel with the single inductor, and another after and in parallel with the single inductor.

12. The single stage EMI filter circuit of claim 1, wherein the specific parasitic inductance is between 2-4% of common mode inductance.

13. A network device comprising:
a housing or chassis;
a power distribution unit in the housing or chassis; and
a single stage electromagnetic interference (EMI) filter circuit in the housing or chassis, wherein the single stage EMI filter circuit includes a power source input configured to connect to a power source, an equivalent common mode and differential mode filter including a single inductor having both common mode inductance for common mode filtering and specific parasitic inductance, a differential capacitance stage connected to the single inductor in parallel, wherein a combination of the specific parasitic inductance and capacitance of the differential capacitance stage are used to provide differential mode filtering, and a power output to the power distribution unit.

14. The network device of claim 13, wherein the power source has a power source type of a plurality of different power source types.

15. The network device of claim 14, wherein the different power source types are Alternating Current (AC) and Direct Current (DC).

16. The network device of claim 14, wherein the different power source types are Direct Current (DC), Sinusoidal Alternating Current (AC), and Quasi Sinusoidal wave AC.

17. The network device of claim 14, wherein the different power source types are any of a 120V Alternating Current (AC), 48V Direct Current (DC), and 75V Cable Television (CATV) power.

18. The network device of claim 13, wherein the specific parasitic inductance is between 2-4% of common mode inductance.

19. A method of single stage electromagnetic interference (EMI) filtering comprising steps of:

receiving power from a power source;

performing common mode filtering with an equivalent common mode and differential mode filter that includes a single inductor and that has both common mode inductance for common mode filtering and specific parasitic inductance; and performing differential mode filtering with the single inductor and a differential capacitance stage connected to the single inductor in parallel, wherein a combination of the specific parasitic inductance and capacitance of the differential capacitance stage are used for the differential mode filtering.

20. The method of claim 19, wherein the power source has a power source type of a plurality of different power source types.

* * * * *